United States Patent
Zhou

(10) Patent No.: US 7,184,736 B2
(45) Date of Patent: Feb. 27, 2007

(54) APPARATUS AND METHOD FOR DYNAMIC DC OFFSET DETECTION AND CANCELLATION USING HIGH PASS FILTER WITH VARIABLE IMPEDANCE AND CORNER FREQUENCY

(75) Inventor: Sining Zhou, Irvine, CA (US)

(73) Assignee: Orion Microelectronics Corporation, Irvine, CA (US)

( * ) Notice: Subject to any disclaimer, the term of this patent is extended or adjusted under 35 U.S.C. 154(b) by 10 days.

(21) Appl. No.: 10/795,076

(22) Filed: Mar. 5, 2004

(65) Prior Publication Data

US 2005/0197089 A1  Sep. 8, 2005

(51) Int. Cl.
*H04B 1/10* (2006.01)

(52) U.S. Cl. .................. 455/296; 455/307; 455/114.2; 455/278.1; 375/319; 375/285; 375/346; 327/307

(58) Field of Classification Search .............. 455/296, 455/24, 501, 504, 63.1, 67.11, 67.13, 570, 455/114.2, 123, 127, 2, 136–140, 266, 130, 455/249.1, 248, 550.1, 575.1, 424, 425, 561, 455/232.1, 247.1, 245.1, 251.1, 256–257, 455/306, 286, 283, 278.1, 323, 333, 334, 455/337, 307, 2.96, 506; 375/319, 295, 285, 375/346; 370/444, 342, 350, 351, 441; 333/172, 333/173; 327/113, 559, 552, 308, 553, 554–558, 327/537, 311, 344, 321, 437, 307; 307/98, 307/112, 113; 326/116, 119, 115, 23, 24, 326/109

See application file for complete search history.

(56) References Cited

U.S. PATENT DOCUMENTS

| | | | |
|---|---|---|---|
| 6,437,639 B1 * | 8/2002 | Nguyen et al. | 327/558 |
| 6,882,216 B2 * | 4/2005 | Kang | 327/552 |
| 2003/0072320 A1 * | 4/2003 | Seo et al. | 370/441 |
| 2003/0086516 A1 * | 5/2003 | Wagner | 375/350 |
| 2003/0222716 A1 * | 12/2003 | Kumeta et al. | 330/253 |
| 2004/0097212 A1 * | 5/2004 | Matsumoto et al. | 455/296 |
| 2004/0169532 A1 * | 9/2004 | Kim | 327/113 |
| 2004/0176055 A1 * | 9/2004 | Vepsalainen et al. | 455/130 |
| 2004/0247046 A1 * | 12/2004 | Hsiao | 375/319 |

\* cited by examiner

*Primary Examiner*—Edward F. Urban
*Assistant Examiner*—Charles Chow
(74) *Attorney, Agent, or Firm*—Foley & Lardner LLP

(57) ABSTRACT

A fixed impedance in parallel with a variable impedance form a high pass filter with a capacitor. An input signal is provided to the capacitor. The value of the variable impedance is controlled in relation to the magnitude of a dynamic DC offset in the input signal to control the corner frequency of the high pass filter, providing a higher corner frequency and more rapid suppression of dynamic DC offset for larger dynamic DC offset magnitudes.

18 Claims, 4 Drawing Sheets

APPARATUS AND METHOD FOR DYNAMIC DC OFFSET DETECTION AND CANCELLATION USING HIGH PASS FILTER WITH VARIABLE IMPEDANCE AND CORNER FREQUENCY

BACKGROUND OF THE INVENTION

1. Field of the Invention

Embodiments of the present invention relate to DC offset cancellation techniques and, in particular, to DC offset cancellation techniques in devices such as, for example, direct conversion devices.

2. Description of Related Art

The performance of electronic devices such as cellular telephones, personal digital assistants and other wireless and wired devices can be directly affected by the internal components of the devices. For example, the performance of an electronic device is often related to the amount of DC offset in the various components within the device.

In a direct down conversion transceiver, for example, a large DC offset pulse can appear immediately following a gain switching stage in a receiver chain. Traditional techniques for detecting and canceling DC offset pulses generally have transfer functions with very low cutoff frequencies. Thus, using traditional techniques, a rapidly changing DC offset could pass through a circuit unabated, causing transient saturation in subsequent stages before settling to a level that does not affect circuit performance.

The inability of traditional techniques to detect and cancel DC offset pulses in a timely fashion can be detrimental to the performance of circuits within an electronic device and to the overall performance of the device itself. For example, the settling time for some DC offset pulses in some high frequency devices can be as long as 100 microseconds. A settling time of this duration can upset the functionality of many high speed circuits. Indeed, a complete loss of data can occur during a settling period of this length, thereby disrupting operation of the device.

FIG. 1 shows an example of a conventional direct conversion receiver circuit. The circuit receives an input signal RFin and generates I and Q baseband signals BB_I and BB_Q. Downconversion of the input signal is performed by a programmable gain amplifier 100, mixers 102, 104, low pass filters 106, 108, DC offset cancellation elements 110, 112, programmable gain amplifiers 114, 116, and DC offset cancellation elements 118, 120. Among these elements, the programmable gain amplifiers 100, 114, 116 and the low pass filters 106, 108 have gains that are controlled by a gain control section 122, and these gains change continuously in response to various factors such as signal strength. When the signal processed by these elements includes a DC component, a change in gain will produce a corresponding change in the value of the DC component, referred to herein as a dynamic DC offset. The DC offset cancellation elements 110, 112, 118, 120 of the conventional circuit are relatively ineffective for suppressing dynamic DC offset. These elements are typically implemented as simple high pass filters. The dynamic DC offset is essentially a high frequency event, and so the dynamic DC offset propagates through the DC offset cancellation elements 110, 112, 118, 120 and the other circuit elements, and will be received and amplified along with the baseband signal by downstream stages.

FIGS. 4a and 4b show an example of a simulated dynamic DC offset waveform produced by a gain change. FIG. 4a shows the waveform on a scale measured in microseconds. At this scale the dynamic DC offset appears to occur virtually instantaneously. FIG. 4b shows the waveform of FIG. 4a using a scale measured in nanoseconds. At this scale it is seen that a dynamic DC offset of 1 volt occurs in less than 10 nanoseconds. FIGS. 5a and 5b show the simulated response of the DC offset cancellation elements of the conventional circuit of FIG. 1 to the waveform of FIGS. 4a and 4b. As seen in FIGS. 5a and 5b, the conventional DC offset cancellation elements pass the dynamic DC offset in its entirety, causing the direct conversion receiver circuit to have a settling time that is significantly in excess of 20 microseconds, and typically in the range of 100 microseconds. Thus a direct conversion receiver circuit that uses the prior art DC offset cancellation elements is ineffective in canceling dynamic DC offset, allowing dynamic DC offsets of 1 volt or more to be introduced into baseband signals.

SUMMARY OF THE INVENTION

In accordance with a preferred embodiment of the invention, a fixed impedance in parallel with a variable impedance form a high pass filter with a capacitor. An input signal that includes a dynamic DC offset is provided to the capacitor. The value of the variable impedance is controlled in relation to the magnitude of dynamic DC offset to control the corner frequency of the high pass filter, providing a higher corner frequency and more rapid elimination of the dynamic DC offset for larger dynamic DC offset magnitudes.

The variable impedance may be implemented as one or more short channel MOS transistors. The variable impedance may be switched between high and low impedance by a comparator that provides an output signal to gates of the MOS transistors and that compares the dynamic DC offset in the input signal to a threshold voltage.

The fixed impedance may be implemented as one or more long channel MOS transistors. The fixed impedance may be controlled by a control voltage that maintains the gate to source voltage Vgs of the MOS transistor at an essentially constant level to maintain the impedance of the MOS transistor at an essentially constant value.

DESCRIPTION OF THE DRAWINGS

A detailed description of embodiments of the invention will be made with reference to the accompanying drawings, wherein like numerals designate corresponding parts in the several figures.

DETAILED DESCRIPTION

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the preferred embodiments of the present invention.

Figure 2A:
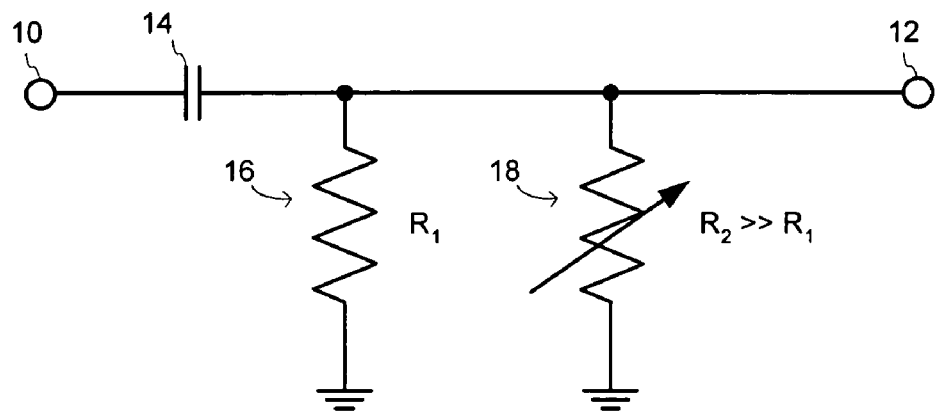
FIG. 2a shows an equivalent circuit diagram of a circuit for canceling dynamic DC offset when the dynamic DC offset does not exceed a threshold value according to a preferred embodiment of the present invention.
Figure 2B:
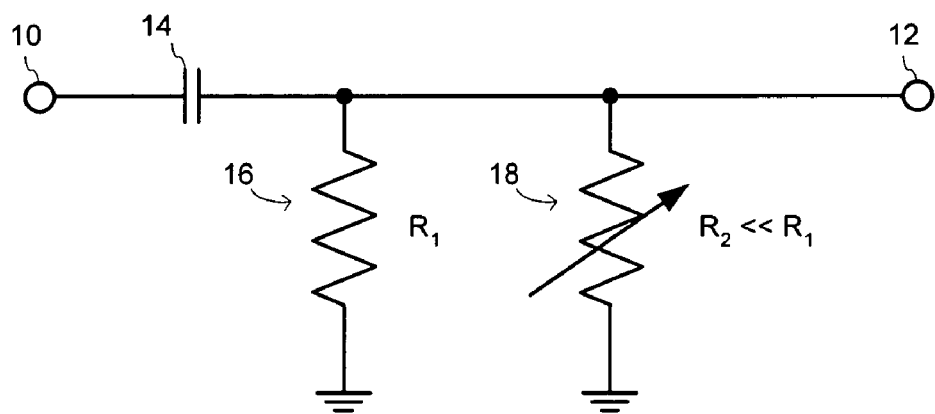
FIG. 2b shows an equivalent circuit diagram of a circuit for canceling dynamic DC offset when the dynamic DC offset exceeds a threshold value according to a preferred embodiment of the present invention.

A dynamic DC offset cancellation circuit in accordance with the preferred embodiment operates as a high pass filter having a variable corner frequency that is set in response to the magnitude of the dynamic DC offset of an input signal received by the filter. FIGS. 2a and 2b show equivalent diagrams of a dynamic DC offset cancellation circuit in accordance with a preferred embodiment of the invention. The equivalent circuit is comprised of an input 10 and an output 12. A high pass filter implemented between the input 10 and the output 12 is modeled as a capacitor 14, a fixed impedance 16 and a variable impedance 18. FIG. 2a shows the circuit during a state in which there is no dynamic DC offset or a small dynamic DC offset in the input signal. In this state, the impedance of the variable impedance 18 is made to be significantly larger than the impedance of the fixed impedance 16. Consequently the variable impedance 18 has a negligible effect on the high pass filter and the corner frequency of the high pass filter is determined by the values of the capacitor 14 and the fixed impedance 16. The diagram of FIG. 2b shows the circuit during a state in which there is a large dynamic DC offset in the input signal. In this state the impedance of the variable impedance 18 is made to be significantly smaller than the impedance of the fixed impedance 16. Consequently the fixed impedance 16 has a negligible effect on the high pass filter and the corner frequency of the high pass filter is determined by the values of the capacitor 14 and the variable impedance 18. The equivalent circuit of FIG. 2b has a higher corner frequency than the circuit of FIG. 2a, and so dynamic DC offset is eliminated more rapidly in the state shown in FIG. 2b then in the state shown in FIG. 2a.

Figure 3:
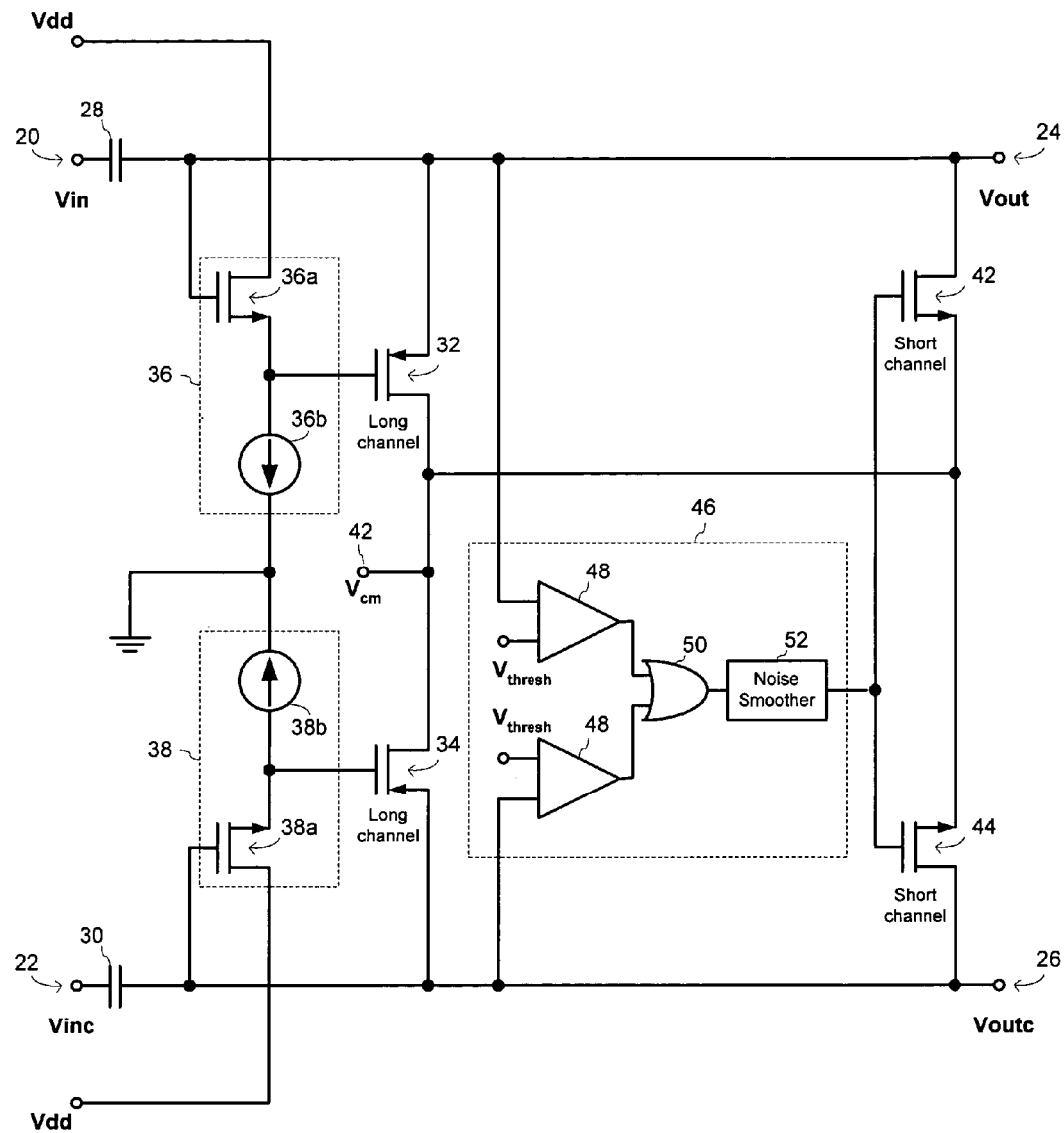
FIG. 3 shows a generalized schematic diagram of a circuit for detecting and canceling dynamic DC offset according to a preferred embodiment of the present invention.

In accordance with the preferred embodiment of the invention, the rate of dynamic DC offset cancellation is varied in response to the magnitude of the dynamic DC offset through controlling the value of the variable impedance relative to the fixed impedance. FIG. 3 shows a schematic diagram of a dynamic DC offset cancellation circuit in accordance with the preferred embodiment of the invention. In this circuit, differential input signals Vin, Vinc are received at differential inputs 20, 22. The differential input signals are coupled to differential outputs 24, 26 through capacitors 28, 30. The input signals are further coupled to respective fixed impedance devices 32, 34 that are controlled by associated impedance controllers 36, 38. The input signals are also coupled to respective variable impedance devices 42, 44 that are controlled by a controller 46. The fixed impedance devices 32, 34 and the variable impedance devices 42, 44 and their associated controllers correspond generally to the fixed impedance 16 and variable impedance 18 of FIG. 2a and FIG. 2b.

In the circuit of FIG. 3, the fixed impedance devices 32, 34 are implemented as long channel PMOS transistors coupled at their drains to a common voltage 40. The use of long channel devices provides a relatively high turn-on resistance. The impedance controllers 36, 38 associated with the fixed impedance devices 32, 34 are each comprised of NMOS transistors 36a, 38a having their sources tied to current sources 36b, 38b and having their drains tied to a power supply Vdd. Constant current sources 36b, 38b drive constant currents through the NMOS transistors 36a, 38a, thereby establishing a constant gate to source voltage Vgs in each transistor 36a, 38a. The source voltages of the transistors 36a, 38a are provided as control voltages to the gates of the fixed impedance devices 32, 34. The gate of the transistors 36a, 38a and the sources of the fixed impedance devices 32, 34 receive an input signal from a capacitor 28, 30. As a result, a constant gate to source voltage Vgs is present in each of the fixed impedance devices 32, 34. This voltage is approximately equal to the gate to source voltage generated in the source followers 36a, 38a by the current sources 36b, 38b. Because this value remains essentially constant, it maintains the impedance of the fixed impedance devices 32, 34 at approximately constant equal values irrespective of the magnitude of any dynamic DC offset in the input signals.

The variable impedance devices 42, 44 are implemented as short channel NMOS transistors coupled at their drains to the common voltage 40. The use of short channel devices provides a relatively low turn on resistance. The parameters of the variable impedance devices 42, 44 are chosen to provide a significantly lower turn on resistance than the fixed impedance devices 32, 34. The controller 46 provides a signal to the gates of the variable impedance devices 42, 44 to turn the variable impedance devices on and off. The controller 46 is comprised of comparators 48, an OR gate 50 and a noise smoother 52. The noise smoother 52 is used to prevent false turn-on of the variable impedance devices resulting from high frequency noise spikes. The noise smoother 52 may be implemented as a first-order low pass filter followed by a Schmitt trigger.

Each of the respective differential input signals is coupled to an input of one of the comparators 48, and respective threshold voltages Vthresh are coupled to the other inputs of the comparators. The threshold voltages are selected in accordance with the magnitude of dynamic DC offset that is desired to cause turn on of the variable impedance devices 42, 44. These threshold voltages can be adjusted automatically in correspondence with the gain of following stages to determines the tolerable dynamic DC offset at the input nodes.

In operation, the circuit of FIG. 3 acts as a high pass filter that receives differential input signals at its inputs 20, 22 and eliminates any dynamic DC offset. The corner frequency of the high pass filter is determined by the value of the capacitors 28, 30, the values of the fixed impedance devices 32, 34, and the values of the variable impedance devices 42, 44. When the amount of dynamic DC offset in the differential input signal is less than the threshold voltages Vthresh supplied to the comparators 48, the variable impedance devices 42, 44 remain off. As a result, the high pass filter is comprised of the capacitor is 28, 38 and the fixed impedance devices 32, 34 which have high impedance. This yields a relatively low corner frequency and dynamic DC offset cancellation is achieved at a rate that is acceptable for small offsets. When the amount of DC offset in the differential input signals exceeds the threshold voltage Vthresh supplied to either of the comparators 48, the variable impedance devices 42, 44 are turned on, producing impedances that are substantially lower than those of the fixed impedance devices 32, 34. As a result, the high pass filter is comprised of the capacitors 28, 38 and the fixed impedance devices 32, 34 in parallel with the much lower impedance is of the variable impedance devices 42, 44. This increases the corner frequency of the high pass filter, producing more rapid elimination of the dynamic DC offset component of the input signals.

Figure 4A:
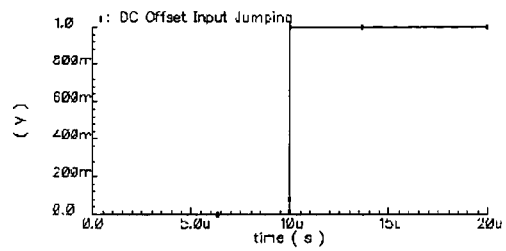
FIGS. 4a and 4b show an example of a dynamic DC offset waveform.
Figure 4B:
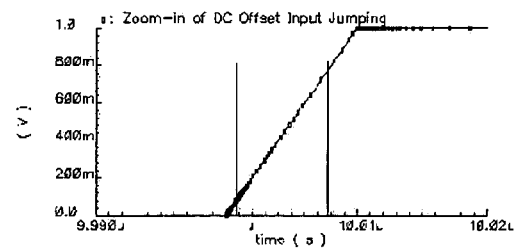
Figure 5A:
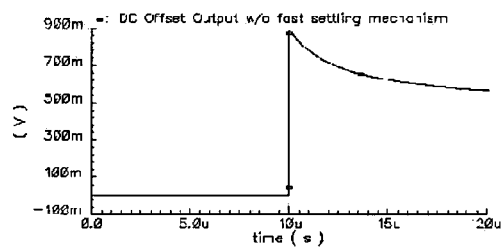
FIGS. 5a and 5b show the response of conventional DC offset cancellation elements to the dynamic DC offset waveforms of FIGS. 4a and 4b.
Figure 5B:
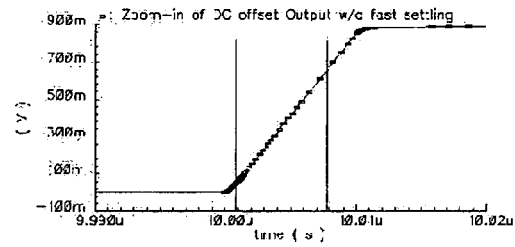
Figure 6A:
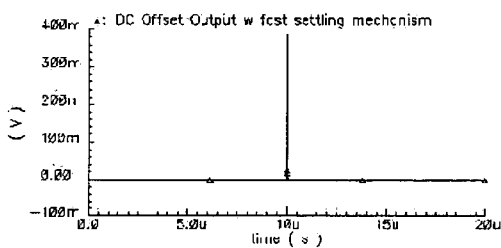
FIGS. 6a and 6b show the response of the circuit of FIG. 3 to the dynamic DC offset waveforms of FIGS. 4a and 4b.
Figure 6B:
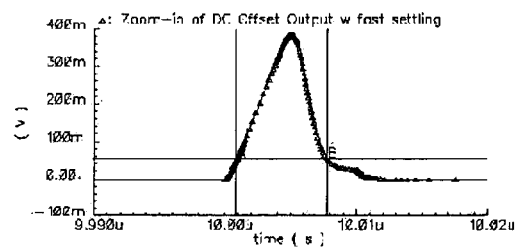

FIGS. 6a and 6b show a simulation of the response of the circuit of FIG. 3 to the dynamic DC offset waveform of FIGS. 4a and 4b. As seen in FIG. 6a, the response to the dynamic DC offset is virtually instantaneous. As seen by comparison of FIG. 6b to FIG. 4b, cancellation of the dynamic DC offset begins before the dynamic DC offset attains its peak value, and complete suppression of the dynamic DC offset is achieved within approximately 10 nanoseconds.

Figure 1:
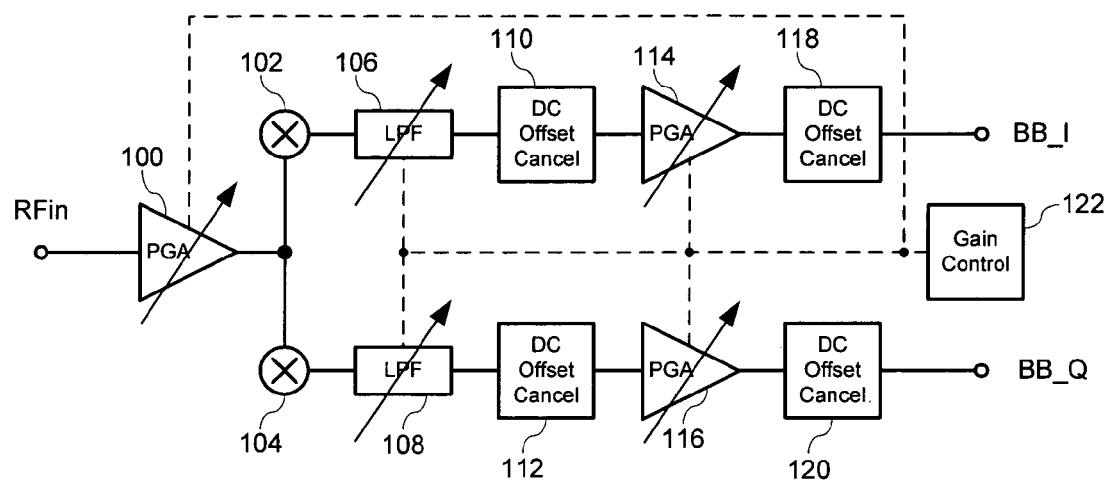
FIG. 1 shows an example of a conventional direct conversion receiver circuit.

The circuit of FIG. 3 and other circuits in accordance with FIGS. 2a and 2b may be implemented in receiver circuits such as the direct conversion receiver circuit as shown in FIG. 1. For example, the circuit of FIG. 3 may be substituted for the DC offset cancellation blocks 118, 120 of the circuit of FIG. 1 to provide improved suppression of dynamic DC offset.

The circuit for detecting and canceling a dynamic DC offset may be implemented as an integrated circuit, as a discrete circuit, or as a hybrid circuit. For example, if the circuit for detecting and canceling dynamic DC offset is realized as an integrated circuit, it may be fabricated on silicon, gallium arsenide or some other semiconductor.

The preferred embodiment of the invention has the advantage that a dynamic DC offset is detected and cancelled in a manner that corresponds to the magnitude of the dynamic DC offset, thereby maintaining a short cancellation time even for dynamic DC offsets of large magnitude. Embodiments of the present invention are well-suited for a variety of electronic devices. For example, embodiments of the present invention may be used in direct conversion devices that demodulate high frequency signals directly to based band.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other types of purposes. Thus, while the embodiments illustrated in the figures and described above are presently preferred for various reasons as described herein, it should be understood that these embodiments are offered by way of example only. The invention is not limited to a particular embodiment, but extends to various modifications, combinations, and permutations that fall within the scope of the claims and their equivalents.

What is claimed is:

1. A circuit for suppressing dynamic DC offset, comprising:
   a capacitor receiving an input signal;
   a fixed impedance comprising a MOS transistor forming a high pass filter with the capacitor;
   an impedance control circuit providing a voltage to a gate of the MOS transistor of the fixed impedance, the impedance control circuit comprising a source follower receiving a source voltage at its drain and a constant current source coupled to the source of the source follower, wherein the input signal is provided to the gate of the source follower and to the source of the MOS transistor of the fixed impedance, and wherein the source voltage of the source follower is provided to the gate of the MOS transistor of the fixed impedance;
   a variable impedance in parallel with the fixed impedance; and
   a control circuit receiving an output signal of said capacitor and controlling the value of the variable impedance in correspondence with the value of a dynamic DC offset in the output signal of said capacitor to control the corner frequency of the high pass filter in response to the magnitude of the dynamic DC offset.

2. The dynamic DC offset cancellation circuit claimed in claim 1, wherein the control circuit switches the value of the variable impedance between a high impedance value and a low impedance value in accordance with the magnitude of dynamic DC offset.

3. The dynamic DC offset cancellation circuit claimed in claim 1, wherein the variable impedance comprises a MOS transistor.

4. The dynamic DC offset cancellation circuit claimed in claim 3, wherein the control circuit comprises a comparator that switches on the MOS transistor when the magnitude of the dynamic DC offset exceeds a threshold value.

5. The dynamic DC offset cancellation circuit claimed in claim 3, wherein the MOS transistor of the variable impedance is a short channel device.

6. The dynamic DC offset cancellation circuit claimed in claim 1, wherein the MOS transistor of the variable impedance is a long channel device.

7. A circuit for suppressing dynamic DC offset in a differential signal, comprising:
   a first capacitor receiving an input signal;
   a second capacitor receiving a complementary input signal;
   a first fixed impedance comprising a first MOS transistor in parallel with a first variable impedance and forming a high pass filter with the first capacitor;
   a second fixed impedance comprising a second MOS transistor in parallel with a second variable impedance and forming a high pass filter with the second capacitor;
   a first impedance control circuit providing a voltage to a gate of the first MOS transistor of the first fixed impedance, the first impedance control circuit comprising a first source follower receiving a source voltage at its drain and a constant current source coupled to the source of the first source follower, wherein the input signal is provided to the gate of the first source follower and to the source of the first MOS transistor of the first fixed impedance, and wherein the drain voltage of the first source follower is provided to the gate of the first MOS transistor of the first fixed impedance;
   a second impedance control circuit providing a voltage to a gate of the second MOS transistor of the second fixed impedance, the second impedance control circuit comprising a second source follower receiving a source voltage at its drain and a constant current source coupled to the source of the second source follower, wherein the complementary input signal is provided to the gate of the second source follower and to the source of the second MOS transistor of the second fixed impedance, and wherein the source voltage of the second source follower is provided to the gate of the second MOS transistor of the second fixed impedance; and
   a control circuit receiving respective output signals from said first capacitor and said second capacitor and controlling the impedance value of the first and second variable impedances in correspondence with the value of a dynamic DC offset in either of the respective output signals to control the corner frequencies of the high pass filters in response to the magnitude of the dynamic DC offset.

8. The dynamic DC offset cancellation circuit claimed in claim 7, wherein the control circuit switches the values of the first and second variable impedances between high impedance values and low impedance values in accordance with the magnitude of the dynamic DC offset.

9. The dynamic DC offset cancellation circuit claimed in claim 7, wherein the first and second variable impedances comprise MOS transistors.

10. The dynamic DC offset cancellation circuit claimed in claim 9, wherein the control circuit comprises a comparator that switches on the MOS transistor when the magnitude of the dynamic DC offset exceeds a threshold value.

11. The dynamic DC offset cancellation circuit claimed in claim 9, wherein the MOS transistors of the variable impedances are short channel devices.

12. The dynamic DC offset cancellation circuit claimed in claim 7, wherein the MOS transistor of the variable impedance is along channel device.

13. A circuit for suppressing dynamic DC offset in differential output signals, comprising:
a first capacitor receiving an input signal and supplying an output signal of the circuit;
a second capacitor receiving a complementary input signal and supplying a complementary output signal of the circuit;
a first fixed impedance in parallel with a first variable impedance and forming a high pass filter with the first capacitor;
a second fixed impedance in parallel with a second variable impedance and forming a high pass filter with the second capacitor; and
a control circuit receiving respective output signals from said first capacitor and said second capacitor and providing a control signal to control the impedance values of the first and second variable impedances in correspondence with the value of a dynamic DC offset in either of the output signal and the complementary output signal to control the corner frequencies of the high pass filters in response to the magnitude of dynamic DC offset between the output signal and the complementary output signal, wherein the control circuit comprises:

a first comparator receiving the output signal at one input and providing an output signal when the magnitude of dynamic DC offset in the output signal exceeds a threshold value;
a second comparator receiving the complementary output signal at one input and providing an output signal when the magnitude of dynamic DC offset in the complementary output signal exceeds a threshold value;
and an OR gate receiving outputs of the first and second comparators, the output of the OR gate switching the first and second variable impedances between a high value to a low value in accordance with the outputs of the first and second comparator.

14. The dynamic DC offset cancellation circuit claimed in claim 13, wherein the first and second fixed impedances comprise MOS transistors.

15. The dynamic DC offset cancellation circuit claimed in claim 14, further comprising respective first and second impedance control circuits providing voltages to the gates of the MOS transistors of the fixed impedances.

16. The dynamic DC offset cancellation circuit claimed in claim 15, wherein each of the first and second impedance control circuits comprises:
a source follower receiving a source voltage at its drain; and
a constant current source coupled to the source of the source follower,
wherein an input signal is provided to the gate of the source follower and to the source of the MOS transistor of the fixed impedance, and
wherein the sourse voltage of the source follower is provided to the gate of the MOS transistor of the fixed impedance.

17. The dynamic DC offset cancellation circuit claimed in claim 13, wherein the variable impedances are short channel MOS transistor devices.

18. The dynamic DC offset cancellation circuit claimed in claim 13, wherein the variable impedances are long channel MOS transistor devices.

* * * * *